(12) United States Patent
Okada et al.

(10) Patent No.: US 9,608,008 B2
(45) Date of Patent: Mar. 28, 2017

(54) ACTIVE MATRIX SUBSTRATE AND METHOD FOR PRODUCING SAME

(71) Applicant: Sharp Kabushiki Kaisha, Osaka (JP)

(72) Inventors: Kuniaki Okada, Osaka (JP); Seiichi Uchida, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 15/117,161

(22) PCT Filed: Feb. 12, 2015

(86) PCT No.: PCT/JP2015/053808
§ 371 (c)(1),
(2) Date: Aug. 5, 2016

(87) PCT Pub. No.: WO2015/125685
PCT Pub. Date: Aug. 27, 2015

(65) Prior Publication Data
US 2016/0358943 A1    Dec. 8, 2016

(30) Foreign Application Priority Data

Feb. 21, 2014  (JP) .................................. 2014-031738

(51) Int. Cl.
*H01L 29/10* (2006.01)
*H01L 27/12* (2006.01)
(Continued)

(52) U.S. Cl.
CPC ........ *H01L 27/1225* (2013.01); *G02F 1/1368* (2013.01); *G02F 1/13439* (2013.01);
(Continued)

(58) Field of Classification Search
CPC .............. H01L 27/1225; H01L 27/124; H01L 27/1248; H01L 27/1259; H01L 29/24;
(Continued)

(56) References Cited

U.S. PATENT DOCUMENTS 7,804,089 B2 *  9/2010  Choi .................. G02F 1/13458
                                                        257/57
2008/0024416 A1   1/2008  Onogi et al.
(Continued)

FOREIGN PATENT DOCUMENTS

JP        2008-32899 A    2/2008
JP        2009-31468 A    2/2009
(Continued)

*Primary Examiner* — Tu-Tu Ho
(74) *Attorney, Agent, or Firm* — Chen Yoshimura LLP

(57) ABSTRACT

Each pixel region of an active matrix substrate includes a thin-film transistor, an interlayer insulating layer that includes an organic insulating layer, a transparent connection layer formed on the interlayer insulating layer, an inorganic insulating layer formed on the transparent connection layer, and a pixel electrode formed on the inorganic insulating layer. The transparent connection layer contacts a drain electrode inside of a first contact hole formed in the interlayer insulating layer. The pixel electrode contacts the transparent connection layer inside of a second contact hole formed in the inorganic insulating layer. The first contact hole and the second contact hole do not overlap with one another when a substrate is viewed from a normal direction. Inside the first contact hole, a bottom surface and sidewalls of the first contact hole are covered by the transparent connection layer, the inorganic insulating layer, and the pixel electrode.

14 Claims, 9 Drawing Sheets

(51) Int. Cl.
*G02F 1/1368* (2006.01)
*H01L 29/786* (2006.01)
*G02F 1/1362* (2006.01)
*G02F 1/1333* (2006.01)
*G02F 1/1343* (2006.01)
*H01L 29/24* (2006.01)
*H01L 29/423* (2006.01)
*H01L 29/66* (2006.01)

(52) U.S. Cl.
CPC .. *G02F 1/133345* (2013.01); *G02F 1/134336* (2013.01); *G02F 1/136227* (2013.01); *G02F 1/136286* (2013.01); *H01L 27/124* (2013.01); *H01L 27/1248* (2013.01); *H01L 27/1259* (2013.01); *H01L 29/24* (2013.01); *H01L 29/42356* (2013.01); *H01L 29/66969* (2013.01); *H01L 29/786* (2013.01); *H01L 29/7869* (2013.01); *G02F 2001/134372* (2013.01); *G02F 2001/136295* (2013.01); *G02F 2201/121* (2013.01); *G02F 2201/123* (2013.01)

(58) Field of Classification Search
CPC ......... H01L 29/42356; H01L 29/66969; H01L 29/786; H01L 29/7869; G02F 1/133345; G02F 1/134336; G02F 1/13439; G02F 1/136227; G02F 1/136286; G02F 1/1368; G02F 2001/134372; G02F 2001/136295
USPC .......................................................... 257/43
See application file for complete search history.

(56) References Cited

U.S. PATENT DOCUMENTS

| | | |
|---|---|---|
| 2009/0027579 A1 | 1/2009 | Aota et al. |
| 2012/0138922 A1 | 6/2012 | Yamazaki et al. |
| 2012/0314169 A1 | 12/2012 | Naoe et al. |
| 2015/0053968 A1 | 2/2015 | Misaki et al. |

FOREIGN PATENT DOCUMENTS

| | | |
|---|---|---|
| JP | 2012-134475 A | 7/2012 |
| JP | 2013-3200 A | 1/2013 |
| JP | 2013-127562 A | 6/2013 |
| JP | 2014-16638 A | 1/2014 |
| WO | 2013/146216 A1 | 10/2013 |

* cited by examiner (a)

(b)

(c)

ACTIVE MATRIX SUBSTRATE AND METHOD FOR PRODUCING SAME

TECHNICAL FIELD

The present invention relates to an active matrix substrate, and more particularly to an active matrix substrate suitable for use in a liquid crystal display device.

BACKGROUND ART

Active-matrix liquid crystal display devices typically include an active matrix substrate in which thin-film transistors (TFTs) that function as switching elements are formed for each pixel, an opposite substrate in which color filters or the like are formed, and a liquid crystal layer sandwiched between the active matrix substrate and the opposite substrate. An electric field is applied to the liquid crystal layer by creating a difference in electric potential between a common electrode and pixel electrodes that are electrically connected to the TFTs. This electric field changes the alignment state of the liquid crystal molecules in the liquid crystal layer, thereby making it possible control the transmittance of the pixels in order to display images.

Various display modes have been designed for and are used in active-matrix liquid crystal display devices according to the intended use case. Examples of such display modes include twisted nematic (TN) mode, vertical alignment (VA) mode, in-plane-switching (IPS) mode, and fringe field switching (FFS) mode.

In these types of liquid crystal display devices, the active matrix substrate sometimes includes two transparent conductive layers with an inorganic insulating layer formed therebetween. Here, this electrode structure that includes two transparent conductive layers with an inorganic insulating layer sandwiched therebetween will be referred to as a "bilayer electrode structure" for simplicity.

In a typical FFS mode device, for example, the lower transparent conductive layer functions as the common electrode, and the upper transparent conductive layer has a plurality of slits formed therein and functions as the pixel electrodes.

The applicant conducted research and development on liquid crystal display devices that utilize such a bilayer electrode structure and exhibit auxiliary capacitance. More specifically, the applicant researched configurations in which the lower transparent conductive layer functions as an auxiliary capacitance counter electrode (to which a common voltage or an auxiliary capacitance counter voltage is supplied) and the upper transparent conductive layer functions as the pixel electrodes. This liquid crystal display device is a VA mode device, for example, but the same configuration may be applied to devices of other display modes as well.

Patent Documents 1 to 3, for example, disclose examples of active matrix substrate configurations that have this bilayer electrode structure. In configurations in which the upper transparent conductive layer functions as the pixel electrodes, the upper transparent conductive layer must be electrically connected to the drain electrodes of the TFTs, which are positioned beneath the lower transparent conductive layer.

In the active matrix substrate disclosed in Patent Document 1, for example, an interlayer insulating layer that covers the TFTs and an inorganic insulating layer that is sandwiched between the two transparent conductive layers are both etched to form contact holes therein, and the drain electrodes of the TFTs contact the pixel electrodes inside these contact holes.

Moreover, in the active matrix substrate disclosed in Patent Document 2, an opening formed in an interlayer insulating layer and an opening formed in an inorganic insulating layer are arranged such that an intersecting cross pattern is formed when the substrate is viewed from above. The pixel electrodes are arranged contacting the drain electrodes at the intersections between these two types of openings, where the drain electrodes are exposed.

Meanwhile, Patent Document 3 discloses a configuration in which the drain electrodes are connected to the pixel electrodes via transparent connection layers (relay layers) formed inside contact holes. Here, the connection layers can be formed from the same transparent conductive film as the lower transparent conductive layer.

RELATED ART DOCUMENTS

Patent Documents

Patent Document 1: Japanese Patent Application Laid-Open Publication No. 2008-32899
Patent Document 2: WO 2013/146216
Patent Document 3: Japanese Patent Application Laid-Open Publication No. 2009-31468

SUMMARY OF THE INVENTION

Problems to be Solved by the Invention

However, during the course of their research, the present inventors discovered the following problems with the active matrix substrates disclosed in Patent Documents 1 to 3.

In some configurations, an organic insulating layer that has relatively high water absorptivity is used as the interlayer insulating layer that covers the TFTs. In this case, water moisture or the like can enter the interlayer insulating layer through the sidewalls of the openings formed in the interlayer insulating layer, which can potentially cause the performance of the TFTs beneath the interlayer insulating layer to deteriorate. Liquid crystal display devices that include an active matrix substrate are particularly prone to exchange of water moisture and the like between the interlayer insulating layer and the liquid crystal layer arranged on the pixel electrodes. Moreover, when oxide semiconductor layers are used as the active layers for the TFTs, the effect of water moisture on the performance of the TFTs is particularly pronounced.

An embodiment of the present invention therefore aims to provide an active matrix substrate that inhibits deterioration in the performance of the TFTs due to infiltration of water moisture into the organic insulating layer.

Means for Solving the Problems

An active matrix substrate according to an embodiment of the present invention includes: a substrate; and a plurality of pixel regions arrayed on the substrate in a matrix pattern having a row direction and a column direction, wherein each of the plurality of pixel regions includes: a thin-film transistor supported by the substrate; an interlayer insulating layer that is formed covering the thin-film transistor and that includes an organic insulating layer; a transparent connection layer formed on the interlayer insulating layer; an inorganic insulating layer formed on the transparent connection layer; and a pixel electrode that is formed on the inorganic insulating layer and that is electrically connected to a drain electrode of the thin-film transistor via the transparent connection layer, wherein the transparent connection layer contacts the drain electrode inside a first contact hole formed in the interlayer insulating layer, wherein the pixel electrode contacts the transparent connection layer inside a second contact hole formed in the inorganic insulating layer, wherein, when viewed from a direction normal to the substrate, the first contact hole and the second contact hole do not overlap with one another, and wherein inside the first contact hole, a bottom surface and sidewalls of the first contact hole are covered by the transparent connection layer, the inorganic insulating layer, and the pixel electrode.

In one embodiment, the active matrix substrate further includes: a gate line including a gate electrode of the thin-film transistor and made from a same film as the gate electrode; and a source line including a source electrode of the thin-film transistor and made from a same film as the source electrode, wherein the gate line runs in the row direction and the source line runs in the column direction.

In one embodiment, when viewed from the direction normal to the substrate, the pixel electrode crosses the gate line in the column direction.

In one embodiment, when viewed from the direction normal to the substrate, a width of the first contact hole in the column direction is greater than a width of the first contact hole in the row direction.

In one embodiment, when viewed from the direction normal to the substrate, the second contact hole does not overlap with any of the gate line, the source line, and the drain electrode.

In one embodiment, the first and second contact holes are arrayed in the column direction.

In one embodiment, when viewed from the direction normal to the substrate, the second contact hole overlaps with the gate line.

In one embodiment, when viewed from the direction normal to the substrate, the first and second contact holes are arrayed in the row direction.

In one embodiment, inside the first contact hole, the pixel electrode and the transparent connection layer are separated from one another by the inorganic insulating layer.

In one embodiment, the active matrix substrate further includes: a transparent electrode made from a same transparent conductive film as the transparent connection layer, wherein the transparent electrode is electrically isolated from the transparent connection layer, and wherein at least a portion of the pixel electrode overlaps with the transparent electrode, with the inorganic insulating layer interposed therebetween.

In one embodiment, an active layer of the thin-film transistor is an oxide semiconductor layer.

In one embodiment, the oxide semiconductor layer includes at least one of indium, gallium, and zinc.

In one embodiment, the oxide semiconductor layer is a crystalline substance.

A method of manufacturing an active matrix according to an embodiment of the present invention includes: (a) forming a gate line that includes a gate electrode on a substrate; (b) forming a gate insulating layer that covers the gate line; (c) forming, on the gate insulating layer, a semiconductor layer that functions as an active layer of a thin-film transistor; (d) forming, on the semiconductor layer, a drain electrode and a source line that includes a source electrode, thereby forming a thin-film transistor; (e) forming an interlayer insulating layer including an organic insulating layer and covering the thin-film transistor, the interlayer insulating layer having a first contact hole that exposes a portion of the drain electrode; (f) forming, on the interlayer insulating layer, a transparent connection layer that contacts the drain electrode inside of the first contact hole; (g) forming, on the transparent connection layer, an inorganic insulating layer having a second contact hole that exposes a portion of the transparent connection layer; and (h) forming, on the inorganic insulating layer, a pixel electrode that contacts the transparent connection layer inside of the second contact hole, wherein, when viewed from a direction normal to the substrate, the first contact hole and the second contact hole do not overlap with one another, and wherein a bottom surface and sidewalls of the first contact hole are covered by the transparent connection layer, the inorganic insulating layer, and the pixel electrode.

Effects of the Invention

In the embodiment of the present invention, the sidewalls of the first contact holes formed in the organic insulating layer are covered by a transparent connection layer, an inorganic insulating layer, and the pixel electrodes, thereby making it possible to inhibit infiltration of water moisture into the organic insulating layer via the sidewalls of the first contact holes. This, in turn, makes it possible to inhibit deterioration in the performance of the TFTs due to infiltration of water moisture into the organic insulating layer.

BRIEF DESCRIPTION OF THE DRAWINGS

FIGS. 1($b$) and 1($c$) are cross-sectional views taken along lines A-A' and B-B', respectively, in FIG. 1($a$).

FIGS. 2($b$) and 2($c$) are cross-sectional views taken along lines A-A' and B-B', respectively, in FIG. 2($a$).

FIGS. 3($b$) and 3($c$) are cross-sectional views taken along lines A-A' and B-B', respectively, in FIG. 3($a$).

FIGS. 4($b$) and 4($c$) are cross-sectional views taken along lines A-A' and B-B', respectively, in FIG. 4($a$).

FIGS. 6($b$) and 6($c$) are cross-sectional views taken along lines A-A' and B-B', respectively, in FIG. 6($a$).

FIGS. 8($b$) and 8($c$) are cross-sectional views taken along lines C-C' and D-D', respectively, in FIG. 8($a$).

FIGS. 9(*b*) and 9(*c*) are cross-sectional views taken along lines C-C' and D-D', respectively, in FIG. 9(*a*).

DETAILED DESCRIPTION OF EMBODIMENTS

Next, an active matrix substrate and a method of manufacturing the same according to an embodiment of the present invention will be described with reference to figures. The following description assumes that the active matrix substrate will be used in an FFS mode liquid crystal display device. However, the embodiment of the present invention is not limited to this example and may also be applied to a VA mode liquid crystal display device that has a bilayer electrode structure. Moreover, the present invention is not limited to use in liquid crystal display devices and may also be applied to other types of display devices.

Figure 1:
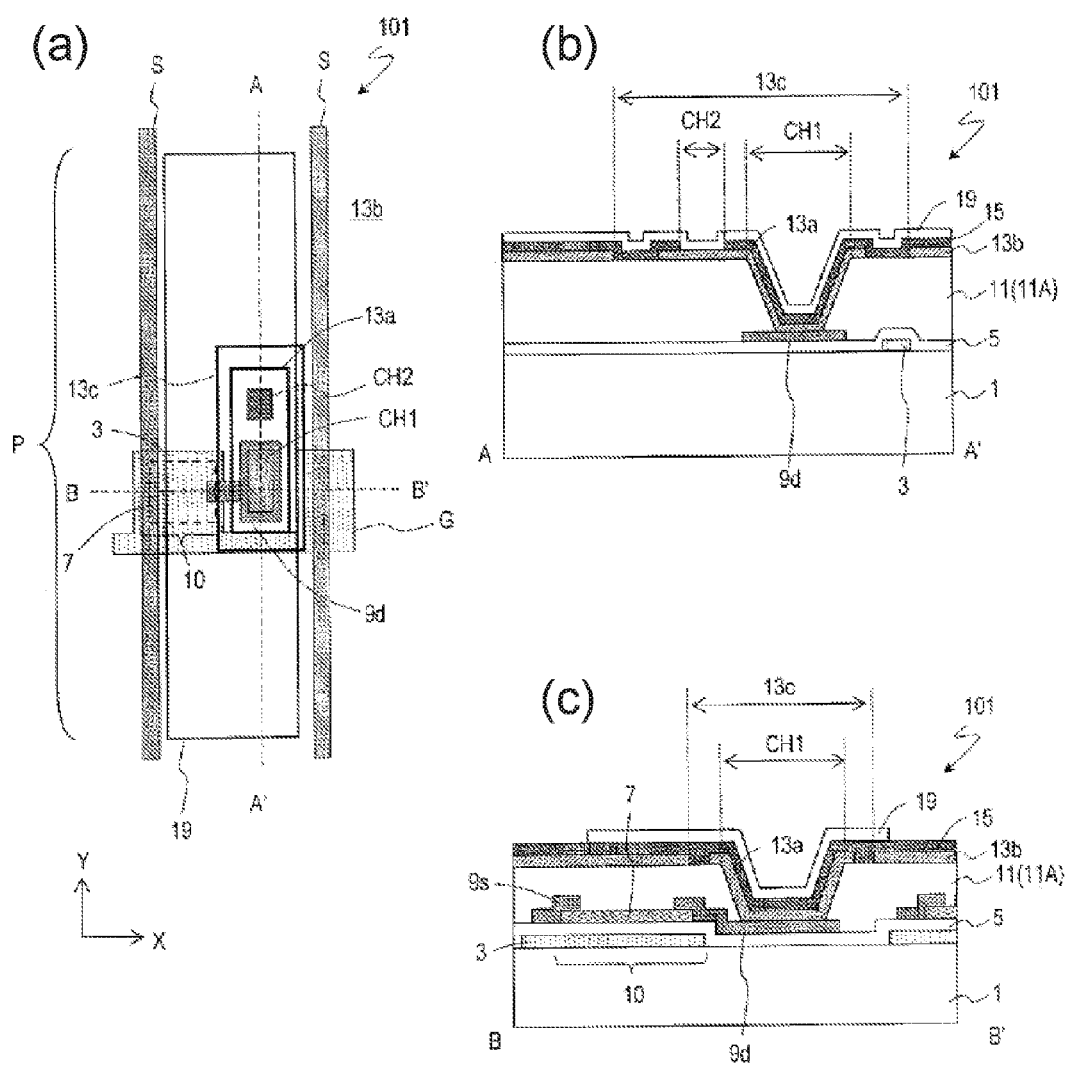
FIG. 1($a$) is a plan view schematically illustrating an active matrix substrate 101 according to an embodiment of the present invention.

FIG. 1(*a*) is a plan view schematically illustrating a first embodiment of an active matrix substrate 101 according to the present invention. FIGS. 1(*b*) and 1(*c*) are cross-sectional views schematically illustrating the active matrix substrate 101. FIG. 1(*b*) is taken along line A-A' in FIG. 1(*a*), and FIG. 1(*c*) is taken along line B-B' in FIG. 1(*a*).

The active matrix substrate 101 includes a plurality of pixel regions P. The plurality of pixel regions P are arranged in a matrix pattern that has a row direction and a column direction. FIGS. 1(*a*) to 1(*c*) illustrate only a single pixel region P. Moreover, in FIG. 1(*a*), the X direction is the row direction and the Y direction is the column direction. Here, these directions are orthogonal to one another but may also be non-orthogonal instead.

Each of the plurality of pixel regions P includes a thin-film transistor (TFT) 10 supported by a substrate 1, an interlayer insulating layer 11 that includes an organic insulating layer 11A and is formed covering the TFT 10, a transparent connection layer 13*a* formed on top of the interlayer insulating layer 11, an inorganic insulating layer 15 formed on top of the transparent connection layer 13*a*, and a pixel electrode 19 formed on top of the inorganic insulating layer 15. The pixel electrode 19 is electrically connected to a drain electrode 9*d* of the TFT 10 via the transparent connection layer 13*a*. The interlayer insulating layer 11 may have any configuration as long as that configuration includes the organic insulating layer 11A. For example, the interlayer insulating layer 11 may have a layered structure that includes a layer made from an inorganic insulating material (an inorganic interlayer insulating layer) as a lower layer and the organic insulating layer 11A as an upper layer.

A first contact hole CH1 is formed in the interlayer insulating layer 11, thereby exposing the drain electrode 9*d*. The transparent connection layer 13*a* is formed contacting the drain electrode 9*d* inside the first contact hole CH1.

Furthermore, a second contact hole CH2 is formed in the inorganic insulating layer 15, thereby exposing the transparent connection layer 13*a*. The first contact hole CH1 and the second contact hole CH2 are arranged so as not to overlap with one another when the substrate 1 is viewed from the direction normal thereto. The pixel electrode 19 contacts the transparent connection layer 13*a* inside the second contact hole CH2.

In the present specification, a region for connecting the transparent connection layer 13*a* to the drain electrode 9*d* (and which includes the first contact hole CH1) will be referred to as a "transparent connection layer-drain electrode contact region", and a region for connecting the pixel electrode 19 to the transparent connection layer 13*a* (and which includes the second contact hole CH2) will be referred to as a "pixel electrode-transparent connection layer contact region".

In the present embodiment, portions of the transparent connection layer 13*a*, the inorganic insulating layer 15, and the pixel electrode 19 are positioned inside the first contact hole CH1 that is formed in the interlayer insulating layer 11. Inside the first contact hole CH1, the bottom surface and sidewalls of the first contact hole CH1 are covered by the transparent connection layer 13*a*, the inorganic insulating layer 15, and the pixel electrode 19.

Furthermore, inside the first contact hole CH1, the transparent connection layer 13*a* and the pixel electrode 19 are separated from one another by the inorganic insulating layer 15. The inorganic insulating layer 15 does not necessarily need to be a planarizing film and may instead be an insulating film that is thinner than the interlayer insulating layer 11, for example. In this case, the transparent connection layer 13*a*, the inorganic insulating layer 15, and the pixel electrode 19 may each have a recess shape that reflects the shape of the first contact hole CH1.

The TFT 10 is a bottom-gate TFT, for example, and includes a gate electrode 3 formed on the substrate 1, a gate insulating layer 5 that covers the gate electrode 3, a semiconductor layer (active layer) 7 formed on top of the gate insulating layer 5, a source electrode 9*s*, and the drain electrode 9*d*. At least a portion of the semiconductor layer 7 is arranged overlapping with the gate electrode 3, with the gate insulating layer 5 interposed therebetween. The source and drain electrodes 9*s* and 9*d* are electrically connected to the semiconductor layer 7. As illustrated in the figure, the source electrode 9*s* is formed covering the entire source-side edge of the semiconductor layer 7, and the drain electrode 9*d* is formed covering only a portion of the drain-side edge of the semiconductor layer 7.

The source and drain electrodes 9*s* and 9*d* may instead be arranged directly contacting the top surface of the semiconductor layer 7 (thereby forming a top-contact structure). Alternatively, the source and drain electrodes 9*s* and 9*d* may be arranged directly contacting the bottom surface of the semiconductor layer 7 (thereby forming a bottom-contact structure). Furthermore, the TFT 10 may include a protective film (an etch stop film) for protecting channels between the semiconductor layer 7 and the source and drain electrodes 9*s* and 9*d* (thereby forming an etch stop structure). In this case, the source and drain electrodes 9*s* and 9*d* contact the semiconductor layer 7 via openings formed in the protective film. Moreover, the TFT 10 may be a top-gate TFT. In this case as well, the TFT may have either a bottom-contact structure or a top-contact structure.

The active matrix substrate 101 may further include a transparent electrode 13*b* formed from the same transparent conductive film as the transparent connection layer 13*a*. The transparent electrode 13*b* is electrically separated from the transparent connection layer 13*a*. Here, the transparent electrode 13*b* includes an opening 13*c* formed by opening a region that includes the transparent connection layer-drain electrode contact region in which the first contact hole CH1 is formed and the pixel electrode-transparent connection layer contact region in which the second contact hole CH2 is formed. The transparent connection layer 13*a* is formed inside the opening 13*c* and separated from the transparent electrode 13*b*. Therefore, when the substrate 1 is viewed from the normal direction, the transparent connection layer 13*a* and the first and second contact holes CH1 and CH2 are arranged within the edges of the opening 13*c*.

A portion of the transparent electrode 13b can be used as an auxiliary capacitance electrode. In this case, at least a portion of the pixel electrode 19 is arranged overlapping with the transparent electrode 13b, with the inorganic insulating layer 15 interposed therebetween. In this way, the pixel electrode 19, the transparent electrode 13b, and the inorganic insulating layer 15 arranged therebetween function as an auxiliary capacitor. This auxiliary capacitor is formed by the transparent electrode 13b and the pixel electrode 19 (which is also transparent), and therefore a large capacitance value can be achieved without decreasing the aperture ratio of the pixel.

In the active matrix substrate 101 according to the present embodiment, the bottom surface and sidewalls of the first contact hole CH1 formed in the interlayer insulating layer 11 that includes the organic insulating layer 11A are covered by at least three layers: the transparent connection layer 13a, the inorganic insulating layer 15, and the pixel electrode 19. This makes it possible to prevent water moisture or the like from infiltrating into the organic insulating layer 11A via the sidewalls thereof. This, in turn, makes it possible to prevent the water moisture or the like from traveling between portions outside of the active matrix substrate 101 (such as the liquid crystal layer, for example) and the organic insulating layer 11A, thereby making it possible to prevent a deterioration in the performance of the TFT 10 due to the water moisture or the like.

In the active matrix substrates that have a bilayer electrode structure disclosed in Patent Documents 1 and 2, a contact hole is formed going through an interlayer insulating layer and an inorganic insulating layer, and a pixel electrode is formed directly contacting a drain electrode inside the contact hole. Next, this configuration in which the pixel electrode and the drain electrode directly contact one another will be described with reference to figures.

Figure 8:
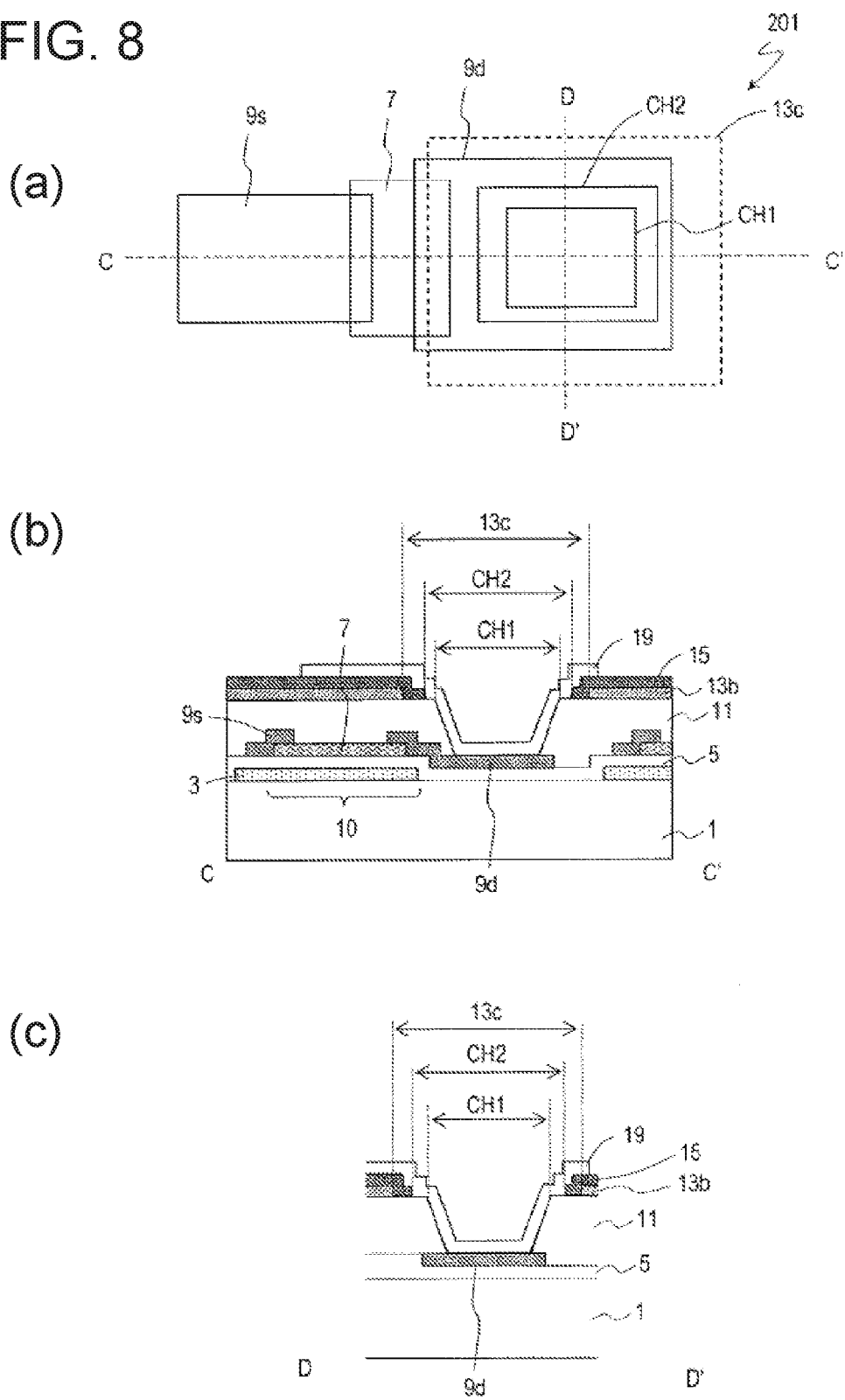
FIG. 8($a$) is a plan view schematically illustrating an active matrix substrate 201 according to a reference example.
Figure 9:
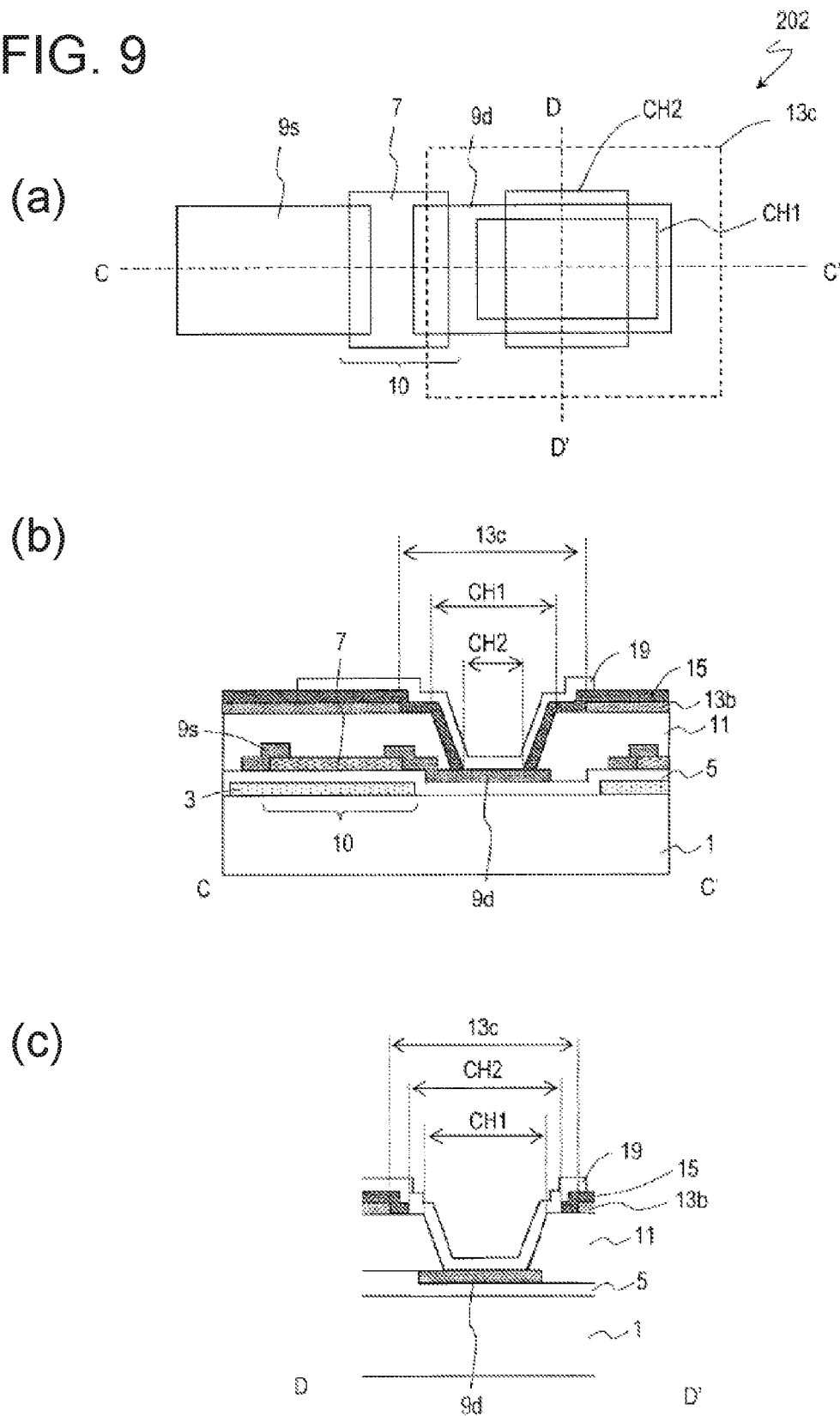
FIG. 9($a$) is a plan view schematically illustrating an active matrix substrate 202 according to another reference example.

FIG. 8(a) is a plan view of an active matrix substrate 201 according to a reference example. FIGS. 8(b) and 8(c) are cross-sectional views of the active matrix substrate 201 taken along lines C-C' and D-D', respectively. FIG. 9(a) is a plan view of an active matrix substrate 202 according to another reference example. FIGS. 9(b) and 9(c) are cross-sectional views of the active matrix substrate 202 taken along lines C-C' and D-D', respectively. In FIGS. 8 and 9, the same reference characters are used for components that are the same as in FIG. 1.

In the active matrix substrate 201 illustrated in FIG. 8, a first contact hole CH1 formed in an interlayer insulating layer 11 and a second contact hole CH2 formed in an inorganic insulating layer 15 are arranged such that the first contact hole CH1 is positioned inside the second contact hole CH2 when a substrate 1 is viewed from the normal direction. An opening 13c for a transparent electrode 13b is formed at a position that does not overlap with the contact holes CH1 and CH2. Inside the first and second contact holes CH1 and CH2, a pixel electrode 19 is arranged directly contacting a drain electrode 9d exposed by the first contact hole CH1. In this configuration, the bottom surface and sidewalls of the first contact hole CH1 are covered only by the pixel electrode 19.

The active matrix substrate 202 illustrated in FIG. 9 is different from the active matrix substrate 201 illustrated in FIG. 8 in that a first contact hole CH1 formed in an interlayer insulating layer 11 and a second contact hole CH2 formed in an inorganic insulating layer 15 are arranged such that an intersecting cross pattern is formed when a substrate 1 is viewed from above. A pixel electrode 19 is arranged directly contacting a drain electrode 9d that is exposed in a region in which the first and second contact holes CH1 and CH2 overlap. In this configuration, the first and second contact holes CH1 and CH2 are arranged in a partially overlapping manner, thereby making it possible to reduce the area required for the contact region in comparison with the active matrix substrate 201 illustrated in FIG. 8. Moreover, as illustrated in FIGS. 9(b) and 9(c), the bottom surface and some of the sidewalls of the first contact hole CH1 are covered only by the pixel electrode 19, and the remaining sidewalls are covered by two layers: the pixel electrode 19 and the inorganic insulating layer 15.

As described above, in the active matrix substrates 201 and 202 according to these reference examples, some or all of the sidewalls of the interlayer insulating layer 11 that includes an organic insulating layer are covered only by the pixel electrode 19. As a result, the sidewalls of the organic insulating layer, which have relatively little coverage from the pixel electrode 19 as well as a relatively high water absorptivity, are exposed to portions outside of the active matrix substrates 201 and 202 (such as liquid crystal layer), and therefore water moisture or the like can infiltrate into the organic insulating layer from these external portions. This can potentially cause problems such as a deterioration in the performance of a TFT 10. This deterioration in the performance of the TFT 10 can become particularly pronounced when the active matrix substrates 201 and 202 are operated in a high-temperature, high-humidity environment. Moreover, particularly when an oxide semiconductor layer is used for a semiconductor layer 7, water moisture can cause an increased deficiency in oxygen in the oxide semiconductor layer, which tends to cause problems such as a decrease in resistance.

Moreover, in the active matrix substrates 201 and 202 according to the reference examples, a configuration not illustrated here in which a connection layer (relay layer) made from the same film as the transparent electrode 13b is formed and the pixel electrode 19 is connected to the drain electrode 9d via this connection layer is conceivable (Patent Document 3). In this case, not only the pixel electrode 19 but also the connection layer is arranged covering some or all of the sidewalls of the first contact hole CH1. However, even with these two transparent conductive films, the sidewalls of the first contact hole CH1 cannot be adequately protected, and therefore it may not be possible to sufficiently inhibit infiltration of water moisture or the like into the organic insulating layer.

Furthermore, although this configuration is not illustrated here, if the second contact hole CH2 formed in the inorganic insulating layer 15 is arranged inside the first contact hole CH1 formed in the interlayer insulating layer 11 when the substrate 1 is viewed from the normal direction, the sidewalls of the first contact hole CH1 can be covered not only by the pixel electrode 19 but also by the inorganic insulating layer 15. In this case, however, the area of the contact region must be increased in order to achieve a sufficient contact area between the pixel electrode 19 and the drain electrode 9d, and therefore the pitch of the pixel regions must be increased.

In contrast, the present embodiment as described above makes it possible to cover all of the sidewalls of the first contact hole CH1 with three layers, including the inorganic insulating layer 15 (which has relatively strong barrier properties). This makes it possible to more reliably inhibit migration of water moisture or the like between the liquid crystal layer and the organic insulating layer via the sidewalls of the first contact hole CH1, for example. Moreover, in the present embodiment, the first contact hole CH1 is arranged closer to the TFT 10 than is the second contact hole CH2. The sidewalls of this contact hole that is positioned near the TFT 10 are protected by three layers, thereby making it possible to effectively prevent deterioration of the performance of the TFT 10.

The active matrix substrate 101 according to the present embodiment further includes a gate line G that runs in the row direction (the X direction) and is made from the same film as the gate electrode 3 and a source line S that runs in the column direction (the Y direction) and is made from the same film as the source electrode 9s. The gate line G includes the gate electrode 3 of the TFT 10. The gate electrode 3 may also be formed as an integrated part of the gate line G. Alternatively, the gate electrode 3 may simply be a portion of the gate line G. The source line S includes the source electrode 9s of the TFT 10. The source electrode 9s may also be formed as an integrated part of the source line S. Alternatively, the source electrode 9s may simply be a portion of the source line S.

The source line S and the gate line G are made from metal films, for example. In this case, the portions of the pixel region P in which the source line S and the gate line G are arranged do not allow visible light to pass through. In the present specification, this region of the pixel region P that does not allow light to pass through will be referred to as a "light-shielding region." Meanwhile, the region of the pixel region P in which light is not blocked by metal films or the like and which does allow visible light to pass through will be referred to as an "aperture region."

In the active matrix substrate 101, the first contact hole CH1 is formed in the light-shielding region (the region in which light is blocked by the drain electrode 9d). Meanwhile, the second contact hole CH2 may be formed in the aperture region. In other words, the second contact hole CH2 may be arranged at a position that does not overlap with any of the metal wires (metal electrodes) used for components such as the gate line G, the drain electrode 9d, and the source line S when the substrate 1 is viewed from the normal direction. The first and second contact holes CH1 and CH2 may be aligned in the column direction, for example.

The pixel electrode-transparent connection layer contact region that includes the second contact hole CH2 is transparent. As a result, the aperture ratio of the pixel (that is, the ratio of the pixel region P occupied by the aperture region) does not decrease even if the second contact hole CH2 is arranged within the aperture region. Moreover, the first contact hole CH1 can be made smaller in size than a conventional contact hole formed going through an inorganic insulating layer and an interlayer insulating layer (see FIGS. 8 and 9). Therefore, the present embodiment makes it possible to reduce the decrease in the pixel aperture ratio due to the contact region as well as increase the pixel aperture ratio in comparison with conventional technologies.

Furthermore, the first contact hole CH1 may be arranged not overlapping with the gate line G when the substrate 1 is viewed from the normal direction. The area of the region in which the drain electrode 9d and the gate line G overlap may be kept small, and the first contact hole CH1 may be arranged above the drain electrode 9d in a region that does not overlap with the gate line G. For example, as illustrated in the figure, the gate line G may have a recess shape when the substrate 1 is viewed from the normal direction, and at least a portion of the first contact hole CH1 may be arranged inside this recess shape.

The arrangement of the first and second contact holes CH1 and CH2 is not limited to the example illustrated here. As will be described in a later embodiment, the second contact hole CH2 may also be arranged overlapping with the gate line G when the substrate 1 is viewed from the normal direction. Furthermore, the first and second contact holes CH1 and CH2 may alternatively be aligned in the row direction.

The first contact hole CH1 may have a greater width in the column direction than in the row direction. In the example illustrated here, when the substrate 1 is viewed from the normal direction, the first contact hole CH1 has a rectangular shape with the long sides running in the column direction and the short sides running in the row direction. Elongating the first contact hole CH1 in the column direction in this way makes it possible to reduce the width of the pixel region P (in the row direction) while still maintaining a sufficient contact area between the drain electrode 9d and the transparent connection layer formed later.

The transparent connection layer 13a may extend out in the column direction from the top of the drain electrode 9d when the substrate 1 is viewed from the normal direction. The transparent connection layer 13a may be greater in width in the column direction than in the row direction. The transparent connection layer 13a may have a rectangular shape that extends in the column direction, for example.

In the example illustrated here, the pixel electrode 19 is arranged spanning across the gate line G in the column direction when the substrate 1 is viewed from the normal direction. Alternatively, the pixel electrode 19 may be arranged overlapping with only a portion of the gate line G. For example, each gate line G may be arranged between adjacent pixel electrodes 19.

It is preferable that the inorganic insulating layer 15 be thinner than the interlayer insulating layer 11. Reducing the thickness of the inorganic insulating layer 15 (to a value less than or equal to 200 nm, for example) makes it possible to reduce the size and step height of the second contact hole CH2. This makes it possible to reduce scattering of transmitted light due to the second contact hole CH2 when the active matrix substrate 101 is used in a display device even when the second contact hole CH2 is arranged in the aperture region, thereby making it possible to reduce any negative effects on the display properties of the display device. Moreover, when the inorganic insulating layer 15 is used as the dielectric of the auxiliary capacitor, the thickness of the inorganic insulating layer 15 may be 50 nm to 300 nm, for example.

The semiconductor layer (active layer) 7 of the TFT 10 may be an oxide semiconductor layer. Oxide semiconductors exhibit high carrier mobility, therefore making it possible to charge the auxiliary capacitor formed by using the bilayer electrode structure (which has a relatively high capacitance) sufficiently quickly. Moreover, oxide semiconductor layers tend to exhibit changes in electrical resistance upon contact with water moisture. Therefore, using an oxide semiconductor layer as the semiconductor layer 7 of the active matrix substrate 101 makes it possible to more effectively prevent decreases in performance due to water moisture.

The oxide semiconductor layer may contain at least one metal element selected from among In, Ga, and Zn, for example. In the present embodiment, the oxide semiconductor layer contains an In—Ga—Zn—O oxide, for example. Here, the In—Ga—Zn—O oxide is a ternary oxide of indium (In), gallium (Ga), and zinc (Zn). The composition ratio of the In, Ga, and Zn is not particularly limited, and the oxide semiconductor layer may contain these elements in ratios such as In:Ga:Zn=2:2:1, In:Ga:Zn=1:1:1, and In:Ga:Zn=1:1:2, for example. This type of oxide semiconductor layer can be formed from an oxide semiconductor film that contains an In—Ga—Zn—O semiconductor. The In—Ga—Zn—O semiconductor may be amorphous or crystalline. When using a crystalline In—Ga—Zn—O semiconductor, it is preferable that a crystalline In—Ga—Zn—O semiconductor in which the c-axis is approximately orthogonal to the layering plane be used. Moreover, Japanese Patent Application Laid-Open Publication No. 2012-134475 discloses an example of the crystal structure of a crystalline In—Ga—Zn—O semiconductor. The entire contents of Japanese Patent Application Laid-Open Publication No. 2012-134475 are hereby incorporated for reference in the present specification. TFTs that have an In—Ga—Zn—O semiconductor layer exhibit high carrier mobility (more than 20 times that of a-Si TFTs) and low leakage current (less than 1/100th that of a-Si TFTs) and are therefore suitable for use both as driving TFTs and pixel TFTs.

The oxide semiconductor layer may contain a different oxide instead of the In—Ga—Zn—O oxide. For example, the oxide semiconductor layer may contain an oxide such as a Zn—O (ZnO), In—Zn—O (IZO), Zn—Ti—O (ZTO), Cd—Ge—O, Cd—Pb—O, In—Sn—Zn—O (such as $In_2O_3$—$SnO_2$—ZnO), or In—Ga—Sn—O oxide.

Moreover, the semiconductor layer 7 is not limited to being an oxide semiconductor layer and may instead be a silicon semiconductor layer such as an amorphous silicon layer, a polysilicon layer, or a microcrystalline silicon layer.

Method of Manufacturing Active Matrix Substrate 101

Figure 2:
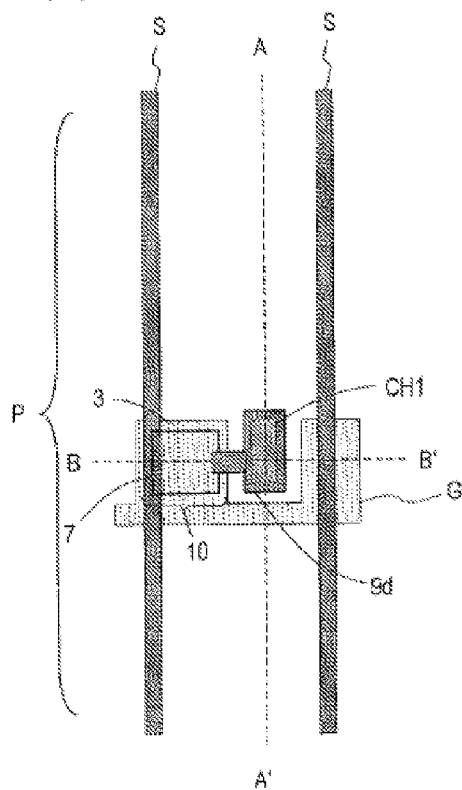
FIG. 2($a$) is a plan view illustrating a step in a method of manufacturing the active matrix substrate 101.
Figure 2:
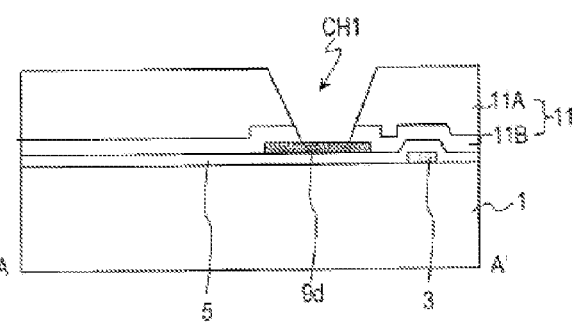
Figure 2:
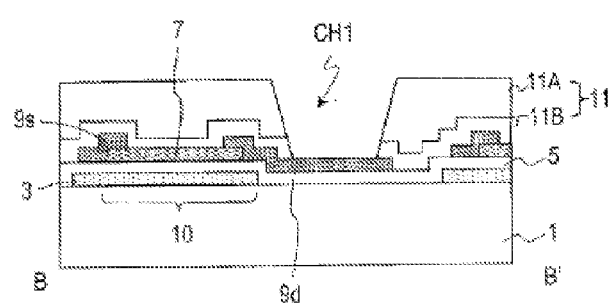
Figure 3:
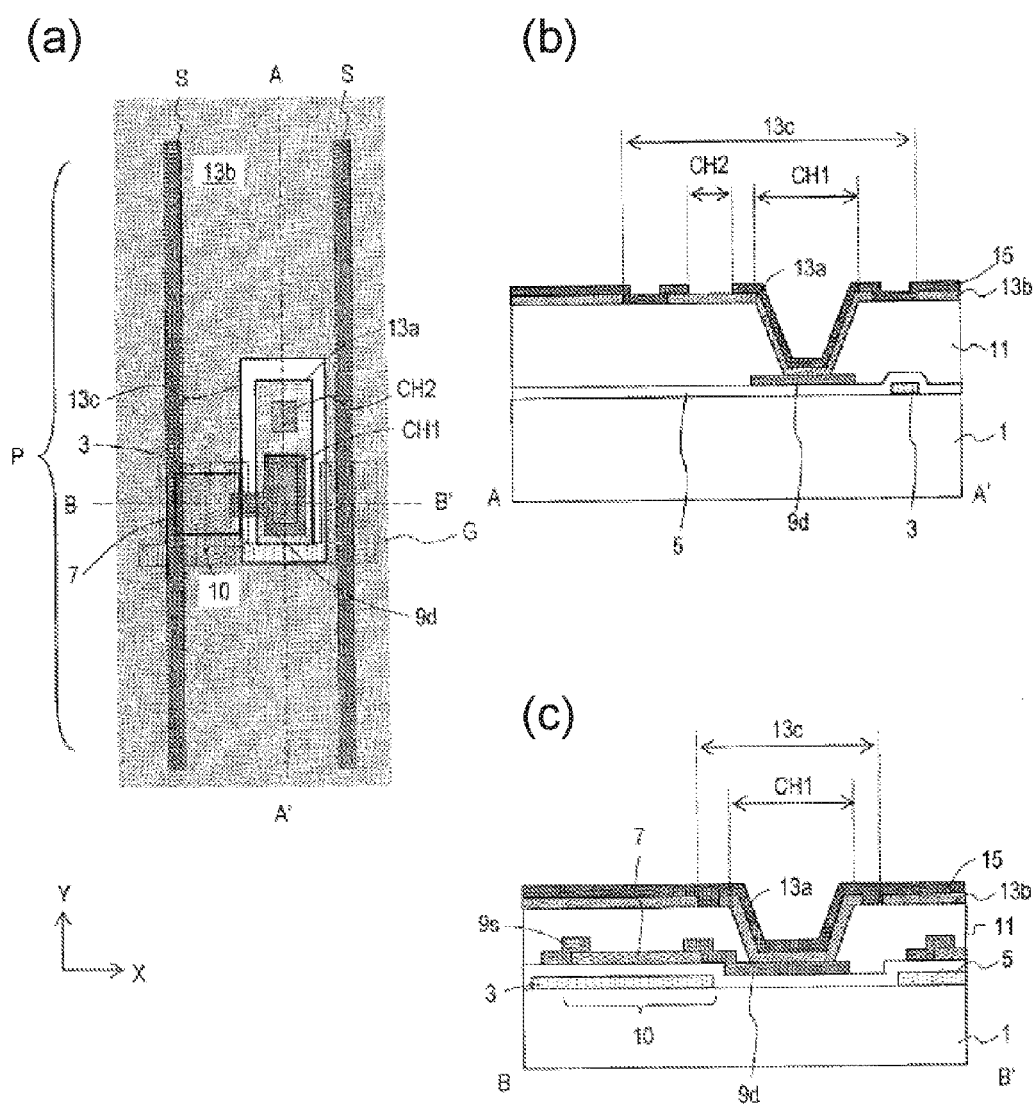
FIG. 3($a$) is a plan view illustrating another step in the method of manufacturing the active matrix substrate 101.

Next, a method of manufacturing the active matrix substrate 101 will be described with reference to FIGS. 2 and 3. In each figure, (a) is a plan view schematically illustrating a step in the method of manufacturing the active matrix substrate 101, and (b) and (c) are cross-sectional views taken along lines A-A' and B-B', respectively, in (a).

First, a process for forming a gate wiring layer, the gate insulating layer 5, the semiconductor layer 7, a source wiring layer, and the interlayer insulating layer 11 on top of the substrate 1 will be described with reference to FIGS. 2(a) to 2(c).

A substrate 1 is prepared. A gate wiring film is formed on top of the substrate 1 and is then patterned using a photolithography process to form the gate wiring layer (which has a thickness of 200 nm to 500 nm, for example).

Any substrate that has an insulating surface may be used for the substrate 1. Examples of substrates that can be used include glass substrates, silicon substrates, heat-resistant plastic substrates (resin substrates), and the like.

The gate wiring layer includes the gate electrode 3, the gate line G, and the like. Here, the gate line G is formed spanning across the pixel region P in the row direction (the X direction). The portion of the gate line G that overlaps with a region in which the semiconductor layer will be formed later functions as the gate electrode 3. The portion of the gate line G that includes the gate electrode 3 may have a greater width than the other portions of the gate line G. For example, the gate line G may have a recess shape within the pixel region P when the substrate 1 is viewed from the normal direction.

The material used for the gate wiring layer is not particularly limited. The gate wiring layer may be made from a metal such as aluminum (Al), tungsten (W), molybdenum (Mo), tantalum (Ta), chromium (Cr), titanium (Ti), or copper (Cu); an alloy of those metals; or a film that contains a nitride of those metals. Alternatively, a multilayer film made by layering together a plurality of such films may be used for the gate wiring layer. Here, the gate wiring layer is a multilayer film that includes a TaN film (with a thickness of 30 nm) as a lower layer and a W film (with a thickness of 300 nm) as an upper layer.

Next, the gate insulating layer 5 is formed covering the gate wiring layer. The gate insulating layer 5 is made from a silicon nitride ($SiN_x$), silicon oxide ($SiO_2$), silicon oxynitride ($SiO_xN_y$; x>y), or silicon nitride oxide ($SiN_xO_y$; x>y) material with a thickness of approximately 100 nm to 600 nm, or from a multilayer film made by layering such films together, for example. Here, the gate insulating layer 5 has a bilayer structure that includes an $SiN_x$ film (with a thickness of 325 nm) as a lower layer and an $SiO_2$ film (with a thickness of 50 nm) as an upper layer and is formed using a CVD method, for example. Moreover, when an oxide semiconductor layer is used for the semiconductor layer 7 and the gate insulating layer 5 is formed as a multilayer film, it is preferable that the uppermost layer of the gate insulating layer 5 (that is, the layer that contacts the semiconductor layer) be a layer that contains oxygen (an oxide layer such as $SiO_2$, for example). The oxygen contained in this oxide layer makes it possible to recover from any oxygen deficiencies that may occur in the oxide semiconductor layer, thereby making it possible to effectively reduce oxygen deficiencies in the oxide semiconductor layer.

Next, the semiconductor layer 7 is formed on top of the gate insulating layer 5. In the present embodiment, the semiconductor layer 7 is an oxide semiconductor layer. Here, a semiconductor film (not illustrated in the figure) with a thickness of 30 nm to 200 nm is formed on top of the gate insulating layer 5 using a sputtering method, for example. Then, the semiconductor film is patterned using photolithography to form the semiconductor layer 7. At least a portion of the semiconductor layer 7 is arranged overlapping with the gate electrode 3, with the gate insulating layer 5 interposed therebetween. Here, an In—Ga—Zn—O semiconductor layer with a thickness of 50 nm is formed as the semiconductor layer 7. The semiconductor layer 7 may also be made from an oxide semiconductor other than In—Ga—Zn—O or from any other well-known semiconductor, such as polycrystalline silicon.

Next, a source wiring film is formed on top of the semiconductor layer 7 and the gate insulating layer 5 using a sputtering method, for example, and the source wiring film is then patterned using a photolithography process. This produces the source wiring layer (which has a thickness of 50 nm to 500 nm, for example). The source wiring layer includes the source electrode 9s, the drain electrode 9d, the source line S, and the like. Here, the source line S is formed overlapping with a portion of the top surface of the semiconductor layer 7. The portion of the source line S that overlaps with the semiconductor layer 7 functions as the source electrode 9s. The drain electrode 9d is arranged overlapping with another portion of the top surface of the semiconductor layer 7. The portion of the semiconductor layer 7 that overlaps with the gate line G and is arranged between the source electrode 9s and the drain electrode 9d functions as a channel region. In this way, the TFT 10 is formed.

The drain electrode 9d may be positioned within the recess shape of the gate line G when the substrate 1 is viewed from the normal direction. This makes it possible to reduce the overlap capacitance between the drain electrode 9d and the gate line G.

The material used for the source wiring layer is not particularly limited. The source wiring layer may be made from a metal such as aluminum (Al), tungsten (W), molybdenum (Mo), tantalum (Ta), copper (Cu), chromium (Cr), or titanium (Ti); an alloy of those metals; or a film that contains a nitride of those metals. Here, the source wiring layer is a multilayer Ti/Al/Ti film formed by layering, in order from the substrate 1 side, a Ti film with a thickness of 30 nm, an Al film with a thickness of 200 nm, and a Ti film with a thickness of 100 nm, for example.

Next, the interlayer insulating layer 11 is formed covering the TFT 10. The interlayer insulating layer 11 includes an inorganic interlayer insulating layer (passivation film) 11B and the organic insulating layer 11A, for example.

The interlayer insulating layer 11 is formed as follows, for example. First, the inorganic interlayer insulating layer 11B is formed covering the TFT 10 using a CVD method, for example. Next, the organic insulating layer 11A is formed on top of the inorganic interlayer insulating layer 11B using a coating method, for example. Then, the organic insulating layer 11A is patterned to form an opening in a portion positioned above the drain electrode 9d. Next, the inorganic interlayer insulating layer 11B is etched, using the patterned organic insulating layer 11A as a mask. In this way, the first contact hole CH1 is formed in the inorganic interlayer insulating layer 11B and the organic insulating layer 11A, thereby exposing a portion of the drain electrode 9d.

The inorganic interlayer insulating layer 11B is made from a silicon nitride ($SiN_x$), silicon oxide ($SiO_2$), silicon oxynitride ($SiO_xN_y$; x>y), or silicon nitride oxide ($SiN_xO_y$; x>y) material with a thickness of approximately 50 nm to 500 nm, or from a multilayer film made by layering such films together, for example. Here, the inorganic interlayer insulating layer 11B is a multilayer film that includes a $SiO_2$ film (with a thickness of 300 nm) as a lower layer and a $SiN_x$ film (with a thickness of 100 nm) as an upper layer.

The organic insulating layer 11A is a transparent resin layer with a thickness of approximately 1000 nm to 5000 nm, for example. In comparison with typical inorganic insulating layers, this transparent resin layer can easily be formed with a greater thickness and also exhibits a lower permittivity. This is advantageous because such a transparent resin layer makes it possible to reduce parasitic capacitance between any electrodes formed on top of the transparent resin layer (such as the pixel electrode) and any electrodes and wires formed beneath the transparent resin layer (such as a gate bus line and a source bus line). The organic insulating layer 11A functions as a planarizing film and may have a top surface that is substantially parallel to the surface of the substrate 1. Here, the organic insulating layer 11A is a positive photosensitive resin film with a thickness of 2000 nm, for example.

In the example described above, the organic insulating layer 11A is patterned first and is then used as a mask to pattern the inorganic interlayer insulating layer 11B. However, the method used to etch the interlayer insulating layer 11 is not limited to this example. For example, the inorganic interlayer insulating layer 11B may be patterned first.

Next, a process for forming the transparent connection layer 13a, the transparent electrode 13b, and the inorganic insulating layer 15 will be described with reference to FIGS. 3(a) to 3(c).

First, a first transparent conductive film (not illustrated in the figure) is formed on top of the interlayer insulating layer 11 and inside the first contact hole CH1 using a sputtering method, and this first transparent conductive film is then patterned using a photolithography process, for example. In this way, the transparent connection layer 13a and the transparent electrode 13b are formed. The transparent connection layer 13a and the transparent electrode 13b are separated from one another. The transparent connection layer 13a is formed inside of the first contact hole CH1 and on top of the interlayer insulating layer 11 and contacts the drain electrode 9d inside of the first contact hole CH1. It is preferable that the transparent connection layer 13a be formed covering the bottom surface and all of the sidewalls of the first contact hole CH1. The transparent electrode 13b is formed over substantially all of the portions other than the contact regions in the pixel region P (that is, the transparent connection layer-drain electrode contact region and the pixel electrode-transparent connection layer contact region). Moreover, the transparent electrode 13b does not need to be divided for each pixel region P and may be formed spanning across a plurality of the pixel regions P.

An indium tin oxide (ITO) film, indium zinc oxide (IZO) film, zinc oxide (ZnO) film, or the like may be used for the first transparent conductive film, for example. The thickness of the first transparent conductive film is 50 nm to 200 nm, for example. Here, an ITO film with a thickness of 100 nm is used for the first transparent conductive film, for example.

Next, an inorganic insulating film is formed on top of the transparent connection layer 13a and the transparent electrode 13b using a CVD method, and this inorganic insulating film is then patterned using a photolithography process, for example. This process is used to form an opening (the second contact hole CH2) in a portion of the inorganic insulating film positioned above the transparent connection layer 13a, thereby exposing the transparent connection layer 13a. In this way, the inorganic insulating layer 15 that includes the second contact hole CH2 is formed. The second contact hole CH2 is arranged at a position that does not overlap with the first contact hole CH1 when the substrate 1 is viewed from the normal direction. The second contact hole CH2 may be arranged in the aperture region of the pixel region P. Here, the second contact hole CH2 is arranged at a position that is aligned with the first contact hole CH1 in the column direction when the substrate 1 is viewed from the normal direction.

It is preferable that no openings be formed in the portion of the inorganic insulating layer 15 that is positioned inside of the first contact hole CH1. This makes it possible to more reliably protect the sidewalls of the first contact hole CH1.

The material used for the inorganic insulating layer 15 is not particularly limited. The inorganic insulating layer 15 may be made from a silicon nitride ($SiN_x$), silicon oxide ($SiO_2$), silicon oxynitride ($SiO_xN_y$; x>y), or silicon nitride oxide ($SiN_xO_y$; x>y) material, or from a multilayer film formed by layering such films together, for example. In the present embodiment, the inorganic insulating layer 15 is used as a capacitive insulating film of the auxiliary capacitor, and therefore it is preferable that the material used for the inorganic insulating layer 15 as well as the thickness thereof be selected as appropriate in order to achieve a prescribed capacitance $C_{CS}$. From the perspective of achieving appropriate permittivity and insulating properties, $SiN_x$ can be used as the material for the inorganic insulating layer 15. The thickness of the inorganic insulating layer 15 is 50 nm to 400 nm, for example. Making the thickness greater than or equal to 50 nm makes it possible to more reliably achieve the desired insulating properties. Meanwhile, keeping the thickness less than or equal to 400 nm makes it possible to more reliably achieve the desired capacitance. In the present embodiment, a $SiN_x$ film with a thickness of 200 nm is used for the inorganic insulating layer 15, for example.

Next, the pixel electrode 19 is formed to complete the active matrix substrate 101 illustrated in FIG. 1.

To form the pixel electrode 19, a second transparent conductive film (not illustrated in the figure) is formed on top of the inorganic insulating layer 15 and inside the second contact hole CH2 using a sputtering method, and this second transparent conductive film is then patterned using a photolithography process, for example. A separate pixel electrode 19 is formed for each pixel region P. The pixel electrode 19 contacts the transparent connection layer 13a inside the second contact hole CH2. In this way, the pixel electrode 19 is electrically connected to the drain electrode 9d via the transparent connection layer 13a. Here, at least a portion of the pixel electrode 19 is arranged overlapping with the transparent electrode 13b with the inorganic insulating layer 15 interposed therebetween, thereby forming the auxiliary capacitor. Moreover, when the active matrix substrate 101 is used in an FFS mode display device, a plurality of slits may be formed in the pixel electrode 19.

An indium tin oxide (ITO) film, indium zinc oxide (IZO) film, zinc oxide (ZnO) film, or the like may be used for the second transparent conductive film, for example. The thickness of the second transparent conductive film is 50 nm to 200 nm, for example. Here, an IZO film with a thickness of 100 nm is used for the second transparent conductive film, for example.

In the present embodiment, it is preferable that the total thickness of the transparent connection layer 13a, the inorganic insulating layer 15, and the pixel electrode 19 be less than the thickness of the interlayer insulating layer 11. This makes it possible to ensure that the trilayer structure that includes the transparent connection layer 13a, the inorganic insulating layer 15, and the pixel electrode 19 can be formed inside of the first contact hole CH1, thereby making it possible to more reliably prevent migration of water moisture or the like into the sidewalls of the first contact hole CH1.

Next, the structure of an active matrix substrate 102 according to another embodiment of the present invention will be described with reference to FIG. 4.

Figure 4:
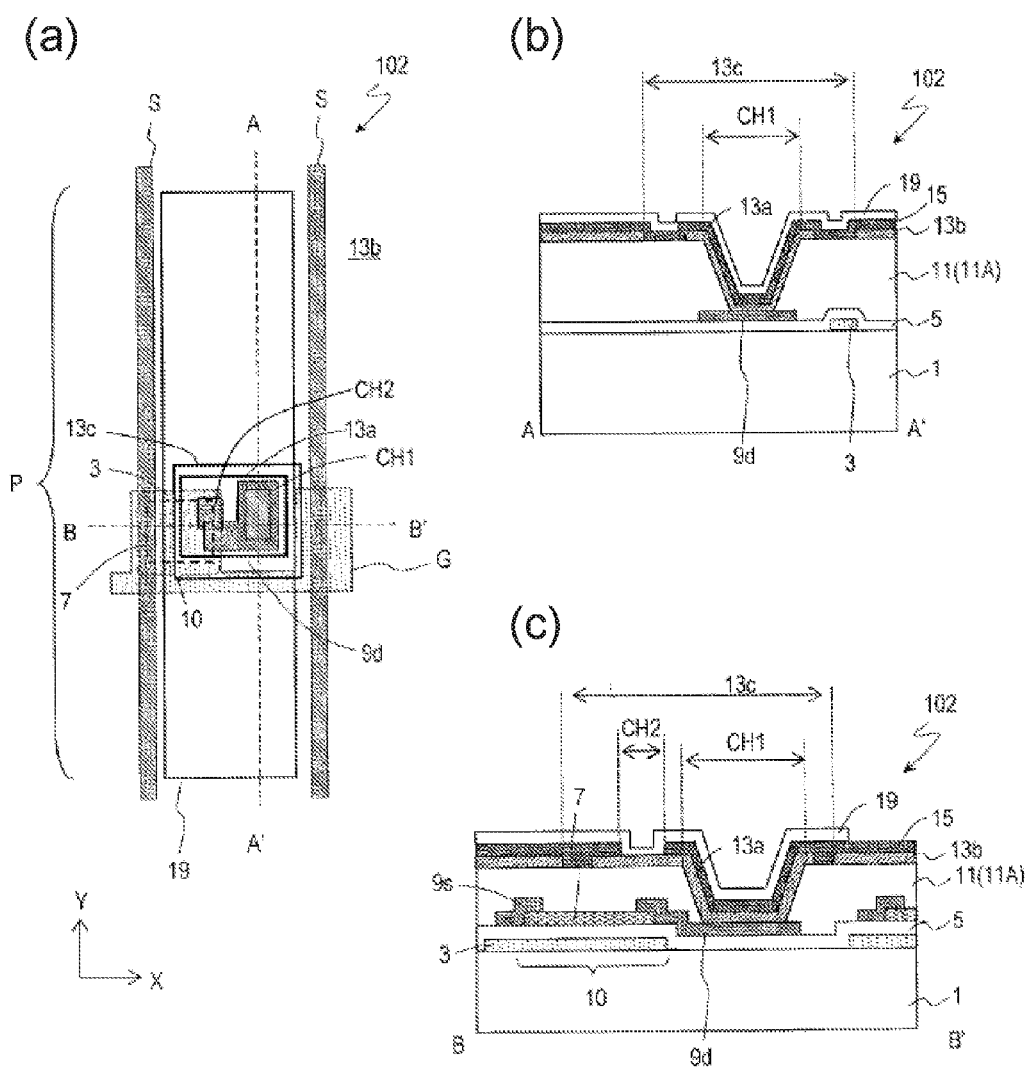
FIG. 4($a$) is a plan view schematically illustrating another active matrix substrate 102 according to an embodiment of the present invention.

FIG. 4(a) is a plan view schematically illustrating a first embodiment of the active matrix substrate 102. FIGS. 4(b) and 4(c) are cross-sectional views schematically illustrating the active matrix substrate 102. FIG. 4(b) is taken along line A-A' in FIG. 4(a), and FIG. 4(c) is taken along line B-B' in FIG. 4(a). In FIG. 4, the same reference characters are used for components that are the same as in FIG. 1.

The active matrix substrate 102 is different from the active matrix substrate 101 illustrated in FIG. 1 in that a second contact hole CH2 is arranged overlapping with a light-shielding region of a pixel region P. For example, the second contact hole CH2 is arranged overlapping with a gate line G when a substrate 1 is viewed from the normal direction. As illustrated in the figure, the second contact hole CH2 may be arranged overlapping not only with the gate line G (or the gate electrode 3) but also with a semiconductor layer 7.

Figure 5:
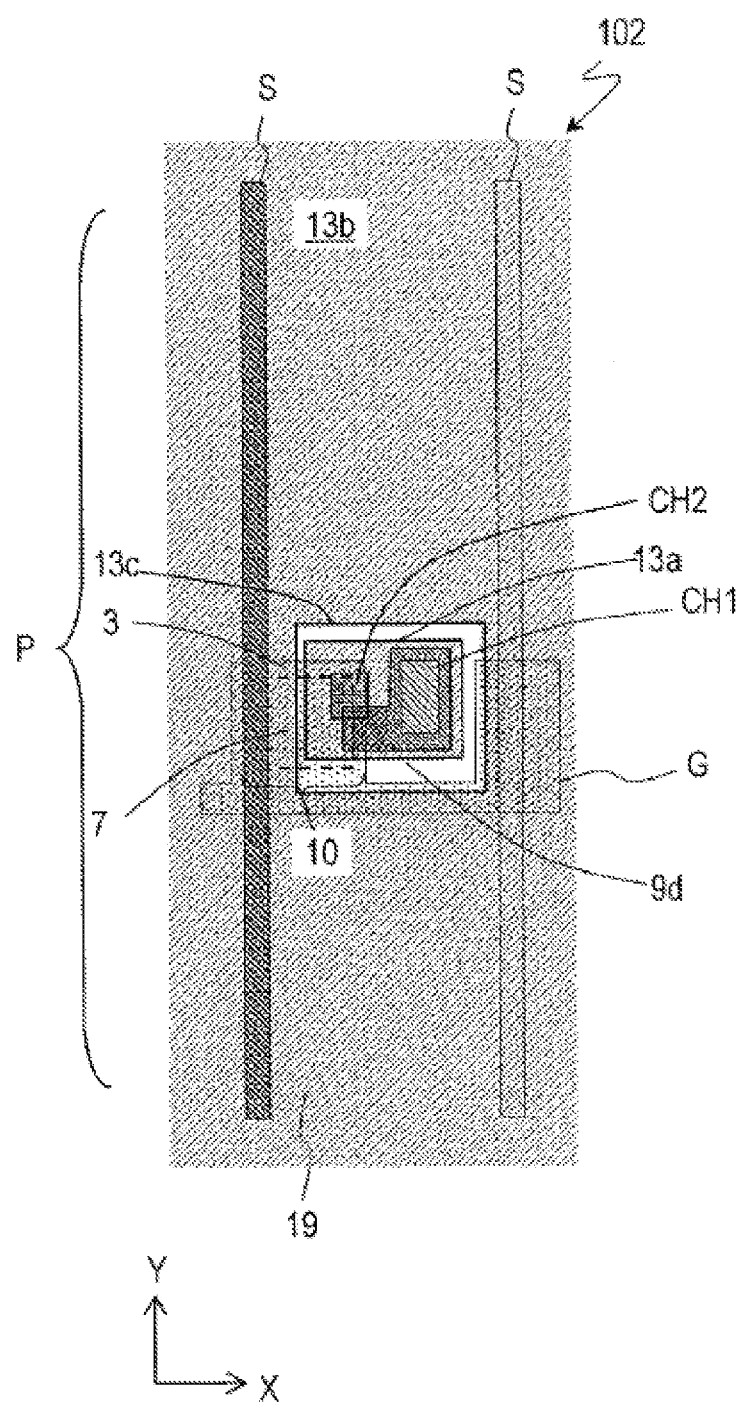
FIG. 5 is a plan view illustrating an example of the shapes of a transparent connection layer and a transparent electrode in the active matrix substrate 102.

FIG. 5 illustrates the shapes of a transparent connection layer 13a and a transparent electrode 13b in the active matrix substrate 102. FIG. 5 also illustrates the planar layout of the active matrix substrate 102 except for a pixel electrode 19. In this example, the transparent connection layer 13a is arranged overlapping with at least a portion of a drain electrode 9d and a portion of the semiconductor layer 7 when the substrate 1 is viewed from the normal direction. The transparent connection layer 13a may run along the gate line G, for example. The transparent electrode 13b is formed separated from the transparent connection layer 13a. The transparent electrode 13b is formed spanning across a plurality of the pixel regions P except for in the regions thereof that include a pixel electrode-transparent connection layer contact region and a transparent connection layer-drain electrode contact region. Moreover, the second contact hole CH2 is formed exposing a portion of the transparent electrode 13b within the light-shielding region of the pixel region P.

In the active matrix substrate 102, an opening 13c is formed in the transparent electrode 13b and runs along the gate line G such that a first contact hole CH1 and the second contact hole CH2 are positioned within the edges of the opening 13c when the substrate 1 is viewed from the normal direction.

The first contact hole CH1 and the second contact hole CH2 may be arranged at positions that are aligned in the row direction when the substrate 1 is viewed from the normal direction. In this case, arranging the second contact hole CH2 to overlap with at least a portion of the gate electrode 3 and the semiconductor layer 7 makes it possible to form the second contact hole CH2 without having to increase the width of the pixel region P in the row direction.

The other aspects of the configuration of the active matrix substrate 102 are the same as the active matrix substrate 101 illustrated in FIG. 1, and therefore a description of these same aspects will be omitted here. Furthermore, the active matrix substrate 102 can be manufactured using the same method described above with reference to FIGS. 2 and 3.

Like in the active matrix substrate 101, in the active matrix substrate 102, the bottom surface and sidewalls of the first contact hole CH1 are covered by at least three layers: the transparent connection layer 13a, an inorganic insulating layer 15, and the pixel electrode 19. This makes it possible to inhibit infiltration of water moisture or the like into an organic insulating layer 11A. Moreover, in the active matrix substrate 102, the second contact hole CH2 is not arranged within the aperture region of the pixel region P. This makes it possible to prevent the second contact hole CH2 from scattering light that passes through the aperture region.

Next, the structure of an active matrix substrate 103 according to yet another embodiment of the present invention will be described with reference to FIG. 6.

Figure 6:
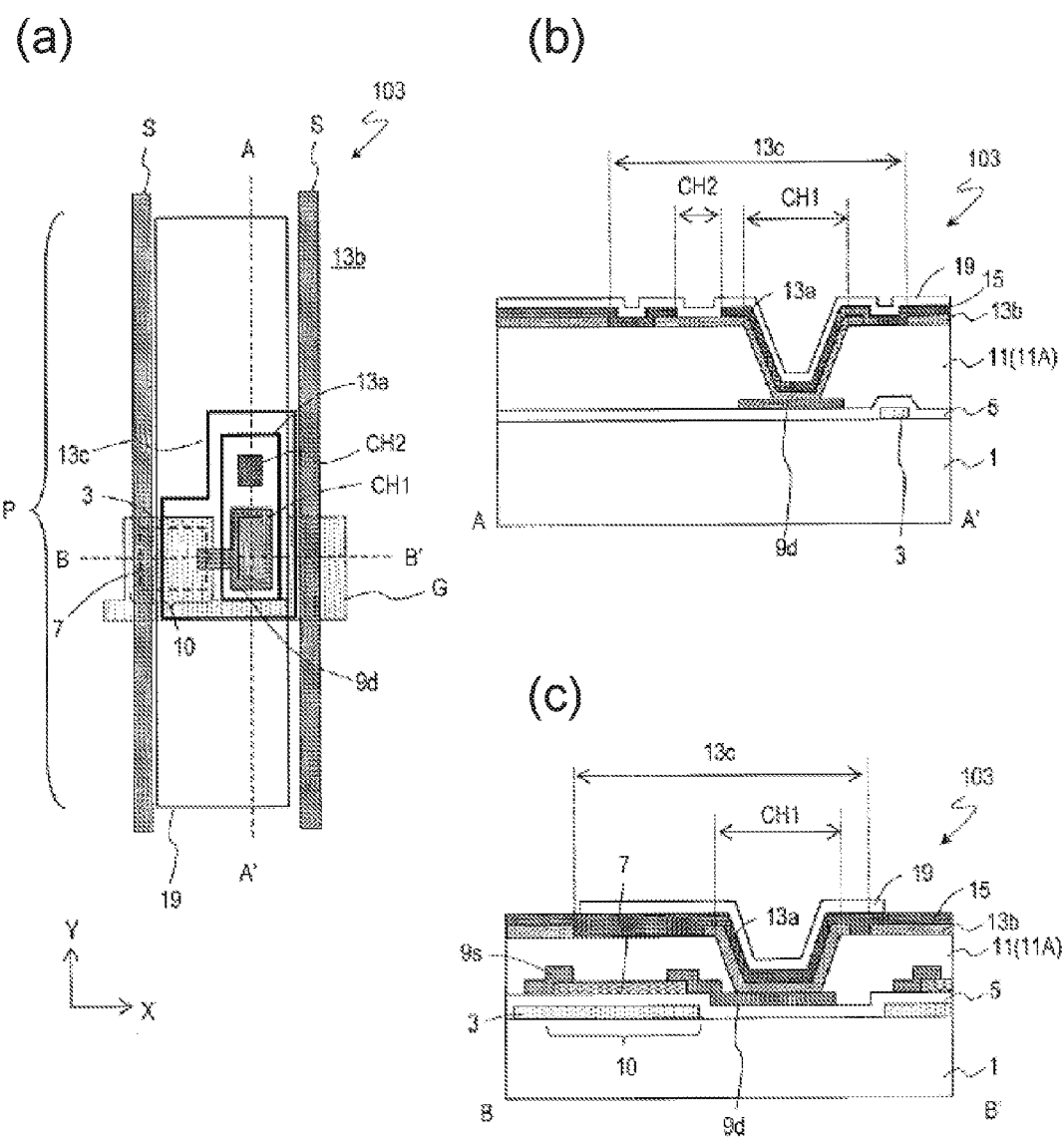
FIG. 6($a$) is a plan view schematically illustrating yet another active matrix substrate 103 according to an embodiment of the present invention.

FIG. 6(a) is a plan view schematically illustrating a first embodiment of the active matrix substrate 103. FIGS. 6(b) and 6(c) are cross-sectional views schematically illustrating the active matrix substrate 103. FIG. 6(b) is taken along line A-A' in FIG. 6(a), and FIG. 6(c) is taken along line B-B' in FIG. 6(a). In FIG. 6, the same reference characters are used for components that are the same as in FIG. 1.

The active matrix substrate 103 is different than the active matrix substrate 101 illustrated in FIG. 1 in that a transparent electrode 13b is not formed above the channel region of a TFT 10.

Figure 7:
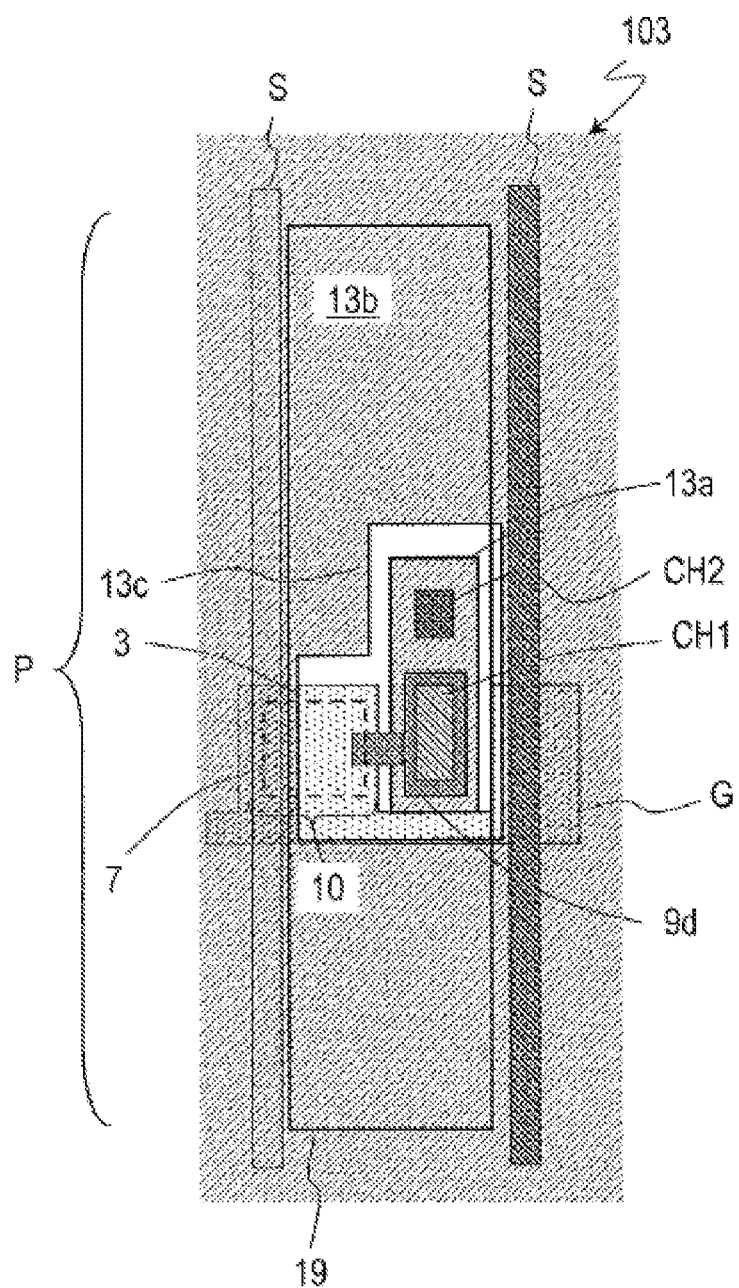
FIG. 7 is a plan view illustrating an example of the shapes of a transparent connection layer and a transparent electrode in the active matrix substrate 103.

FIG. 7 illustrates the shapes of a transparent connection layer 13a and the transparent electrode 13b in the active matrix substrate 103. FIG. 7 also illustrates the planar layout of the active matrix substrate 103 except for a pixel electrode 19. As illustrated in FIG. 7, an opening 13c is formed in the transparent electrode 13b such that not only the transparent connection layer 13a and first and second contact holes CH1 and CH2 that extend in the column direction but also the channel region of a TFT 10 are arranged within the edges of the opening 13c when a substrate 1 is viewed from the normal direction, for example.

The other aspects of the configuration of the active matrix substrate 103 are the same as the active matrix substrate 101 illustrated in FIG. 1, and therefore a description of these same aspects will be omitted here. Furthermore, the active matrix substrate 103 can be manufactured using the same method described above with reference to FIGS. 2 and 3.

Like in the active matrix substrate 101, in the active matrix substrate 103, the bottom surface and sidewalls of the first contact hole CH1 are covered by at least three layers: the transparent connection layer 13a, an inorganic insulating layer 15, and the pixel electrode 19. This makes it possible to inhibit infiltration of water moisture or the like into an organic insulating layer 11A. Moreover, in the active matrix substrate 103, an opening is formed in the transparent electrode 13b such that the transparent electrode 13b does not overlap with the channel region and a drain electrode 9d of the TFT 10. Arranging the transparent electrode 13b so as to not overlap with the drain electrode 9d in this way makes it possible to reduce parasitic capacitance.

The configurations of the active matrix substrates according to the present embodiments are not limited to the examples illustrated in FIGS. 1, 4, and 6. For example, the positional relationship of the first and second contact holes CH1 and CH2 is not limited to the examples illustrated in the figures, and the first and second contact holes CH1 and CH2 may be arranged anywhere as long as the pixel electrode 19 can still be electrically connected to the drain electrode 9d via the transparent connection layer 13a. However, if the first contact hole CH1 and the second contact hole CH2 are positioned too far away from one another when the substrate 1 is viewed from the normal direction, the size of the transparent connection layer 13a must be increased. As a result, the size of the transparent electrode 13b must be decreased, which can potentially make it not possible to form an auxiliary capacitor of a sufficient area. Therefore, it is preferable that the minimum distance between the first contact hole CH1 and the second contact hole CH2 when the substrate 1 is viewed from the normal direction be less than or equal to 10 µm, for example. Meanwhile, from the perspective of protecting the sidewalls of the first contact hole CH1, the minimum distance between the first contact hole CH1 and the second contact hole CH2 may be greater than or equal to 2 µm, for example.

The active matrix substrates 101, 102, and 103 according to the present embodiments are suitable for use in liquid crystal display devices of various display modes.

Moreover, when the active matrix substrates 101, 102, and 103 are used in an FFS mode liquid crystal display device, a plurality of slits may be formed in the pixel electrode 19, and the transparent electrode 13b may be used as a common electrode. The common electrode does not need to be separated for each pixel region P. In the present embodiments, the transparent electrode 13b that functions as the common electrode is formed spanning across the gate lines G and the source lines S and covers a plurality of the pixel regions P. Moreover, arranging at least a portion of the pixel electrode 19 to overlap with the transparent electrode (common electrode) 13b with the inorganic insulating layer 15 interposed therebetween makes it possible to form the auxiliary capacitor, in which the inorganic insulating layer 15 functions as the dielectric.

The active matrix substrates 101, 102, and 103 are also suitable for use in vertical alignment mode (VA mode) liquid crystal display devices. In this case, the transparent electrode 13b functions as an auxiliary capacitance counter electrode (to which a common voltage or an auxiliary capacitance counter voltage is supplied), and the auxiliary capacitor can be formed using the transparent electrode 13b, the pixel electrode 19, and the inorganic insulating layer 15.

Furthermore, the active matrix substrates 101, 102, and 103 according to the present embodiments can be used in display devices other than liquid crystal display devices, such as organic electroluminescent (EL) display devices and in inorganic electroluminescent display devices, for example.

INDUSTRIAL APPLICABILITY

The present invention has a wide variety of applications in devices that include an active matrix substrate, including display devices such as liquid crystal display devices, organic electroluminescent (EL) display devices, and inorganic electroluminescent display devices, for example. The present invention also has a wide variety of applications in devices that include thin-film transistors, including imaging devices such as image sensors as well as other electronic devices such as image input devices and fingerprint readers, for example.

DESCRIPTION OF REFERENCE CHARACTERS 1 substrate
3 gate electrode
5 gate insulating layer
7 semiconductor layer
9s source electrode
9d drain electrode
10 thin-film transistor (TFT)
11A organic insulating layer
11 interlayer insulating layer
13a transparent connection layer
13b transparent electrode
13c opening
15 inorganic insulating layer
19 pixel electrode
CH1 first contact hole (for contact between transparent connection layer and drain electrode)
CH2 second contact hole (for contact between pixel electrode and transparent connection layer)
101, 102, 103 active matrix substrate

What is claimed is:
1. An active matrix substrate, comprising:
a substrate; and
a plurality of pixel regions arrayed on the substrate in a matrix pattern having a row direction and a column direction,
wherein each of the plurality of pixel regions includes:
a thin-film transistor supported by the substrate;
an interlayer insulating layer that is formed covering the thin-film transistor and that includes an organic insulating layer;
a transparent connection layer formed on the interlayer insulating layer;
an inorganic insulating layer formed on the transparent connection layer; and
a pixel electrode that is formed on the inorganic insulating layer and that is electrically connected to a drain electrode of the thin-film transistor via the transparent connection layer,
wherein the transparent connection layer contacts the drain electrode inside a first contact hole formed in the interlayer insulating layer,
wherein the pixel electrode contacts the transparent connection layer inside a second contact hole formed in the inorganic insulating layer,
wherein, when viewed from a direction normal to the substrate, the first contact hole and the second contact hole do not overlap with one another, and wherein inside the first contact hole, a bottom surface and sidewalls of the first contact hole are covered by the transparent connection layer, the inorganic insulating layer, and the pixel electrode.

2. The active matrix substrate according to claim 1, further comprising:
a gate line including a gate electrode of the thin-film transistor and made from a same film as the gate electrode; and
a source line including a source electrode of the thin-film transistor and made from a same film as the source electrode,
wherein the gate line runs in the row direction and the source line runs in the column direction.

3. The active matrix substrate according to claim 2, wherein, when viewed from the direction normal to the substrate, the pixel electrode crosses the gate line in the column direction.

4. The active matrix substrate according to claim 2, wherein, when viewed from the direction normal to the substrate, a width of the first contact hole in the column direction is greater than a width of the first contact hole in the row direction.

5. The active matrix substrate according to claim 2, wherein, when viewed from the direction normal to the substrate, the second contact hole does not overlap with any of the gate line, the source line, and the drain electrode.

6. The active matrix substrate according to claim 2, wherein the first and second contact holes are arrayed in the column direction.

7. The active matrix substrate according to claim 2, wherein, when viewed from the direction normal to the substrate, the second contact hole overlaps with the gate line.

8. The active matrix substrate according to claim 2, wherein, when viewed from the direction normal to the substrate, the first and second contact holes are arrayed in the row direction.

9. The active matrix substrate according to claim 1, wherein, inside the first contact hole, the pixel electrode and the transparent connection layer are separated from one another by the inorganic insulating layer.

10. The active matrix substrate according to claim 1, further comprising:
a transparent electrode made from a same transparent conductive film as the transparent connection layer,
wherein the transparent electrode is electrically isolated from the transparent connection layer, and
wherein at least a portion of the pixel electrode overlaps with the transparent electrode, with the inorganic insulating layer interposed therebetween.

11. The active matrix substrate according to claim 1, wherein an active layer of the thin-film transistor is an oxide semiconductor layer.

12. The active matrix substrate according to claim 11, wherein the oxide semiconductor layer includes at least one of indium, gallium, and zinc.

13. The active matrix substrate according to claim 11, wherein the oxide semiconductor layer is a crystalline substance.

14. A method of manufacturing an active matrix substrate, comprising:
(a) forming a gate line that includes a gate electrode on a substrate;
(b) forming a gate insulating layer that covers the gate line;
(c) forming, on the gate insulating layer, a semiconductor layer that functions as an active layer of a thin-film transistor;
(d) forming, on the semiconductor layer, a drain electrode and a source line that includes a source electrode, thereby forming a thin-film transistor;
(e) forming an interlayer insulating layer including an organic insulating layer and covering the thin-film transistor, the interlayer insulating layer having a first contact hole that exposes a portion of the drain electrode;
(f) forming, on the interlayer insulating layer, a transparent connection layer that contacts the drain electrode inside of the first contact hole;
(g) forming, on the transparent connection layer, an inorganic insulating layer having a second contact hole that exposes a portion of the transparent connection layer; and
(h) forming, on the inorganic insulating layer, a pixel electrode that contacts the transparent connection layer inside of the second contact hole,
wherein, when viewed from a direction normal to the substrate, the first contact hole and the second contact hole do not overlap with one another, and
wherein a bottom surface and sidewalls of the first contact hole are covered by the transparent connection layer, the inorganic insulating layer, and the pixel electrode.

* * * * *